(12) United States Patent
Hu et al.

(10) Patent No.: US 8,334,163 B1
(45) Date of Patent: Dec. 18, 2012

(54) METHOD OF FORMING SOLAR CELL

(75) Inventors: Yen-Cheng Hu, Hsin-Chu (TW); Jen-Chieh Chen, Hsin-Chu (TW); Zhen-Cheng Wu, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/439,879

(22) Filed: Apr. 5, 2012

(30) Foreign Application Priority Data

Nov. 30, 2011 (TW) .............................. 100144000 A

(51) Int. Cl.
*H01L 21/00* (2006.01)
(52) U.S. Cl. ............................................ 438/71; 438/57
(58) Field of Classification Search .................... 438/57, 438/71
See application file for complete search history.

(56) References Cited

U.S. PATENT DOCUMENTS

| | | | |
|---|---|---|---|
| 8,187,979 B2 * | 5/2012 | Ramappa et al. | 438/710 |
| 2009/0020158 A1 | 1/2009 | Ohtsuka | |
| 2010/0267187 A1 | 10/2010 | Funakoshi | |
| 2011/0045624 A1 | 2/2011 | Tsukigata | |
| 2011/0053310 A1 | 3/2011 | Yonezawa | |
| 2011/0265864 A1 * | 11/2011 | Kim et al. | 136/252 |
| 2012/0048356 A1 * | 3/2012 | Jee et al. | 136/252 |

* cited by examiner

*Primary Examiner* — Douglas Menz
(74) *Attorney, Agent, or Firm* — Winston Hsu; Scott Margo

(57) ABSTRACT

A method of forming solar cell includes forming a doping paste on a first surface of a semiconductor substrate to form a selective emitter, to render the selective emitter a non-textured surface, and forming a texturing barrier layer on a second surface of the semiconductor substrate to render the second surface a non-textured surface.

13 Claims, 10 Drawing Sheets

US 8,334,163 B1

METHOD OF FORMING SOLAR CELL

BACKGROUND OF THE DISCLOSURE

1. Field of the Disclosure

The document relates to a method of forming solar cell, and more particularly, to a method of forming solar cell which uses a doping paste to form a selective emitter having a non-textured surface in the front surface (such as first surface) of a semiconductor substrate, and uses a texturing barrier layer to render the back surface (such as second surface) of the semiconductor substrate a non-textured surface.

2. Description of the Prior Art

The energy in which human beings depend on the most is mainly generated by petroleum resources. However, since the petroleum resources on Earth are limited, the energy demands have shifted toward alternative energies dramatically in recently years. Among the alternative energy sources, solar energy shows the most promising potentials.

Due to the problems such as high cost, process complexity and poor photoelectric conversion efficiency, a breakthrough in the development of solar energy is eagerly expected to be achieved. Therefore, to fabricate solar cell with low cost, simple process and high photoelectric conversion efficiency, which can replace high pollutant and high risky energy source, is one of the most principal issue in energy industry.

SUMMARY OF THE DISCLOSURE

In one aspect, a method of forming solar cell is provided to simplify process, save fabrication cost and improve photoelectric conversion efficiency of solar cell.

A method of forming solar cell is provided according to an exemplary embodiment. The method of forming solar cell includes the following steps. A semiconductor substrate having a first surface and a second surface is provided. The first surface has a selective emitter region. A doping paste is formed on the selective emitter region of the first surface of the semiconductor substrate, wherein the doping paste includes a doping agent, a high temperature resistant material and an organic solvent. A texturing barrier layer is formed on the second surface of the semiconductor substrate. A texturing treatment is performed on the semiconductor substrate to make the first surface of the semiconductor substrate, which is outside the selective emitter region and uncovered by the doping paste, form a textured surface, and to make the second surface of the semiconductor substrate form an even surface. A diffusion process is performed to make the doping agent of the doping paste on the selective emitter region diffuse downwardly into the semiconductor substrate to form a selective emitter which is heavily-doped, and a doping gas is introduced during the diffusion process to form a lightly-doped region in the first surface outside the selective emitter region, wherein the selective emitter and the lightly-doped region have a first doping type. The texturing barrier layer and the doping paste are removed. An anti-reflection layer is formed on the first surface of the semiconductor layer. A first electrode is formed on the selective emitter in the selective emitter region. A doped region is formed in the second surface of the semiconductor substrate, wherein the doped region has a second doping type opposite to the first doping type. A second electrode is formed on the second surface of the semiconductor substrate.

These and other aspects of the present invention will no doubt become obvious to those of ordinary skill in the art after reading the following detailed description of the preferred embodiment that is illustrated in the various figures and drawings.

DETAILED DESCRIPTION

To provide a better understanding of the invention to the skilled users in the technology of the invention, exemplary embodiments will be detailed as follows. The exemplary embodiments of the invention are illustrated in the accompanying drawings with numbered elements to elaborate the contents and effects to be achieved.

Figure 1:
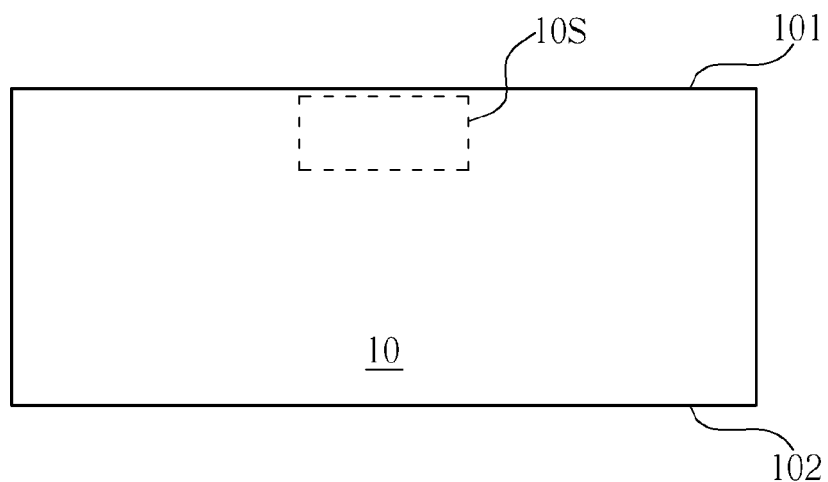
FIGS. 1-8 are schematic diagrams illustrating a method of forming solar cell according to an exemplary embodiment.

Please refer to FIGS. 1-8. FIGS. 1-8 are schematic diagrams illustrating a method of forming solar cell according to an exemplary embodiment. As shown in FIG. 1, a semiconductor substrate 10 is provided. The semiconductor substrate 10 may be, for example, single crystalline silicon substrate, polycrystalline silicon substrate, microcrystalline silicon substrate, or nanocrystalline silicon substrate, but not limited thereto. The semiconductor substrate 10 has a first surface 101 and a second surface 102, and the first surface 101 has a selective emitter region 10S for accommodating a selective emitter to be formed. In this embodiment, the first surface 101 is the front surface (namely light incident surface) of solar cell, while the second surface 102 is the back surface of solar cell.

Figure 2:
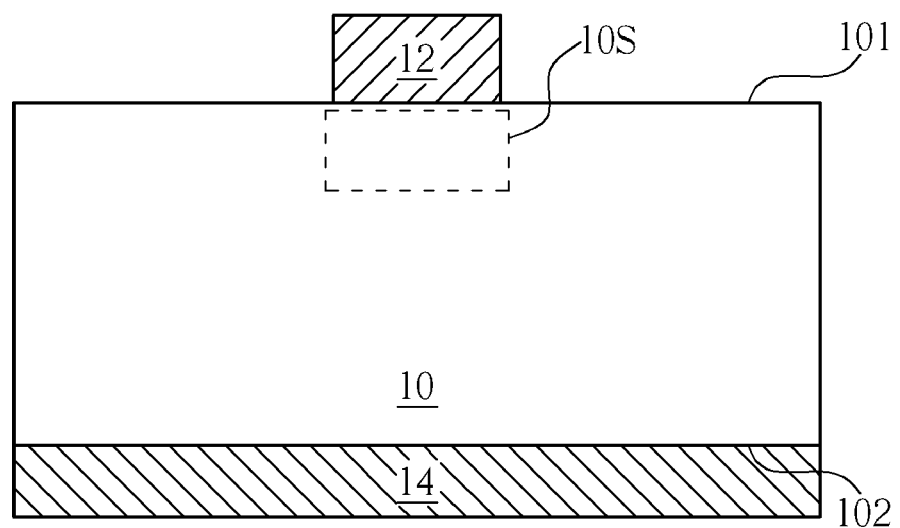

As shown in FIG. 2, a doping paste 12 is formed on the selective emitter region 10S of the first surface 101 of the semiconductor substrate 10. The doping paste 12 may be a single-layered structure or a multi-layered structure. The doping paste 12 includes at least one doping agent, at least one high temperature resistant material (namely thermal resistance material, high temperature endurable material, heat-resisting material, or refractory material), and at least one organic solvent. In this embodiment, the doping agent may include n type dopant or p type dopant. For example, the n type dopant may be phosphorus (P), arsenic (As), antimony (Sb), other suitable dopants, or compound thereof, and the p type dopant may be boron, boron compound, other suitable dopants, or compound thereof, but not limited thereto. The high temperature resistant material may be for instance silicon oxide, silicon oxynitride, silicon nitride, metal oxide such as titanium oxide ($TiO_2$), magnesium oxide (MgO), calcium oxide (CaO), aluminum oxide ($Al_2O_3$), zirconium oxide (ZrO), indium tin oxide (ITO), Zinc oxide (ZnO), etc., or other material, or a mixture of at least two of the aforementioned materials, but not limited thereto. Also, the high temperature resistant material is preferably acid proof (namely acid resistant) and/or alkali proof (namely alkali resistant) for preventing the doping paste 12 from being damaged by acid or alkali in successive process. For example, when the concentration of silicon oxide in the high temperature resistant material is substantially higher than 93%, the high temperature resistant material is able to resist acid erosion and apt to react with alkali under high temperature. When the main component of the high temperature resistant material is magnesium oxide or a mixture of magnesium oxide and calcium oxide, the high temperature resistant material is able to resist alkali erosion under high temperature. When the main components of the high temperature resistant material are silicon oxide and aluminum oxide, based on the concentration of aluminum oxide in the high temperature resistant material, the high temperature resistant material can be classified into three groups: semi-silica group (concentration of aluminum oxide substantially ranging from 15% to 30%); clay group (concentration of aluminum oxide substantially ranging from 30% to 48%); and high-aluminum group (concentration of aluminum oxide substantially higher than 48%). The material and concentration of the high temperature resistant material of the doping paste 12 can be modified based on different requirements of high temperature resistant ability, acid proof ability and alkali proof ability. In addition, the organic solvent of the doping paste 12 may be, for example, selected from at least one of the following solvents: ethylene glycol, ethylene glycol monobutyl ether, ethylene glycol monophenyl ether, methoxymethoxyethanol, ethylene glycol monoacetate, ethylene glycol diacetate, diethylene glycol, diethylene glycol monomethyl ether, diethylene glycol monoethyl ether acetate, diethylene glycol monobutyl ether, diethylene glycol monobutyl ether acetate, diethylene glycol dimethyl ether, diethylene glycol methylethyl ether, diethylene glycol diethyl ether, diethylene glycol acetate, triethylglycol, triethylene glycol monomethyl ether, triethylene glycol monoethyl ether, tetraethylene glycol, polyethylene glycols, propylene glycol, propylene glycol monomethyl ether, propylene glycol monoethyl ether, propylene glycol monobutyl ether, 1-butoxyethoxypropanol, dipropylglycol, dipropylene glycol monomethyl ether, tripropylene glycol monomethyl ether, polypropylene glycols, trimethylene glycol, butanedial, 1,5-pentanedial, hexylene glycol, glycerine, glyceryl acetate, glyceryl diacetate, glyceryl triacetate, trimethylolpropyne, 1,2,6-haxanetriol, dioxane, trioxane, tetrahydrofuran, tetrahydropyran, methylal, diethylacetal, methyl ethyl ketone, methyl isobutyl ketone, diethyl ketone, acetonylacetone, diacetone alcohol, methyl formate, ethyl formate, propyl formate, methyl acetate and ethyl acetate. Additionally, the doping paste 12 may include other additives with specific property. For example, antifoaming agent, adhesion moderator, leveling agent, thixotropic agent, thickening agent (namely gelling agent, viscosifier, or cluster well), wetting agent (namely humectant or osmotic agent), etc., or water, or acid may be selectively added to the doping paste 12.

Figure 5:
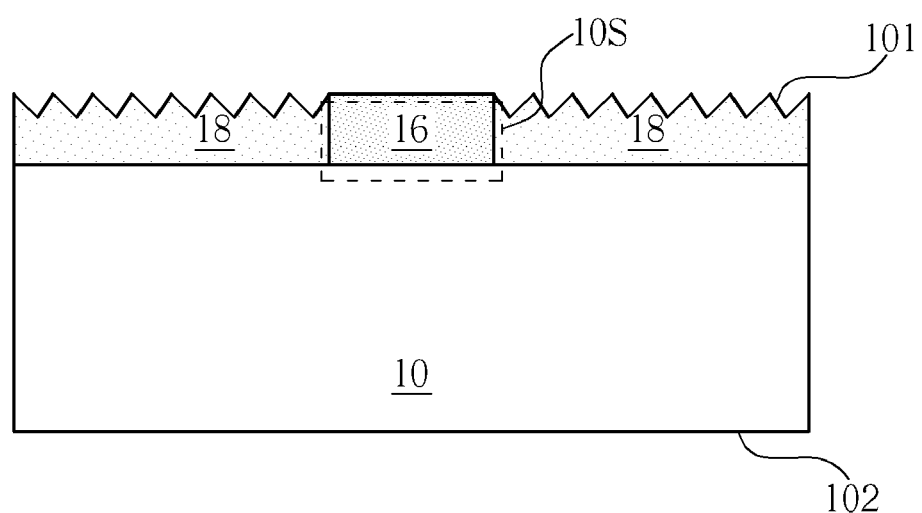

As shown in FIG. 2, a texturing barrier layer 14 is formed on the second surface 102 of the semiconductor substrate 12 to prevent the second surface 12 from turning a textured surface after the texturing treatment. In this embodiment, preferably, the texturing barrier layer 14 is a single-layered structure or a multi-layered structure, and the composition of the texturing barrier layer 14 is similar to that of the doping paste 12. The difference is that the texturing barrier layer 14 excludes the doping agent, but includes the high temperature resistant material and the organic solvent. In such a case, the texturing barrier layer 14 and the doping paste 12 may be removed simultaneously as shown in FIG. 5. The high temperature resistant material and the organic solvent of the texturing barrier layer 14 and the high temperature resistant material and the organic solvent of the doping paste 12 may be identical, but not limited thereto. In other embodiments, the texturing barrier layer 14 may be inorganic material such as silicon oxide, silicon nitride, silicon oxynitride or other proper inorganic material, or organic material such as silicon-containing polymer, polycarbonate, polyterephthalate, polyacrylate or derivatives of the aforementioned material, or other proper organic material. In the steps shown in FIG. 5, at least one etching process is required to thoroughly remove the texturing barrier layer 14. Furthermore, it is preferably to form the texturing barrier layer 14 on the second surface 102 of the semiconductor substrate 10 prior to forming doping paste 12 on the first surface 101, which would protect the first surface 101 from being damaged, but not limited. For example, the doping paste 12 may also be formed on the first surface 101 of the semiconductor substrate 10 prior to forming the texturing barrier layer 14 on the second surface 102. In addition, in this embodiment, the doping paste 12 and the texturing barrier layer 14 may be respectively formed on the first surface 101 and the second surface 102 of the semiconductor substrate 10 by respectively performing a printing process, i.e. two printing processes are respectively performed, but not limited. The doping paste 12 and the texturing barrier layer 14 may be formed by other methods such as by inkjet printing or by screen printing.

Figure 3:
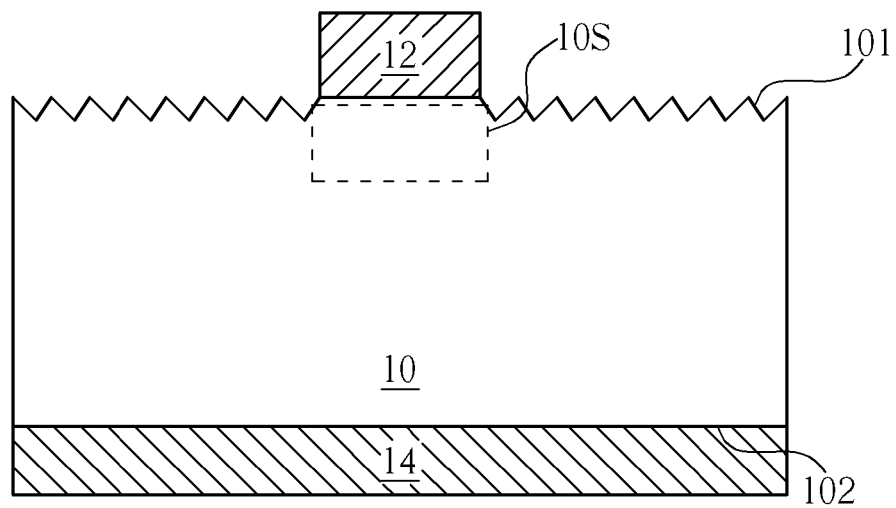

As shown in FIG. 3, a texturing treatment is performed on the semiconductor substrate 10 to make the portion of the first surface 101 of the semiconductor substrate 10, which is outside the selective emitter region 10S and uncovered by the doping paste 12, form a textured surface (namely rough surface). Meanwhile, since the second surface 102 of the semiconductor substrate 10 is covered by the texturing barrier layer 14, the second surface 102 of the semiconductor substrate 10 remains unaffected by the texturing treatment. Thus, the second surface 102 of the semiconductor substrate 10 is an even surface (namely non-textured surface or flatness surface) after the texturing treatment. In this embodiment, the texturing treatment may be a dry etching process e.g. a plasma etching process. Since the selective emitter region 10S of the first surface 101 is covered by the doping paste 12, and the second surface 102 is covered by the texturing barrier layer 14, only the portion of the first surface 101 outside the selective emitter region 10S will be etched to form a textured surface, while the portion of the first surface inside the selective emitter region 10S and the second surface 102 are even surfaces (namely non-textured surface or flatness surface). The texturing treatment is not limited to a dry etching process, and may be a wet etching process which, for example, uses an alkali etching solution (such as solution containing sodium hydroxide (NaOH) solution and isopropyl alcohol (IPA)), or an acid etching solution (such as solution containing hydrofluoric acid (HF) and other solvent). It is noted that forming a non-textured surface in the selective emitter region 10S of the first surface 101 and the second surface 102 means the selective emitter region 10S of the first surface 101 and the second surface 102 are prevented from being damaged, which can inhibit increase of contact resistance. In addition, the non-textured surface increases reflection of light in the second surface 102, and thus the short circuit current gain (Isc gain) of the solar cell can be improved.

Figure 4:
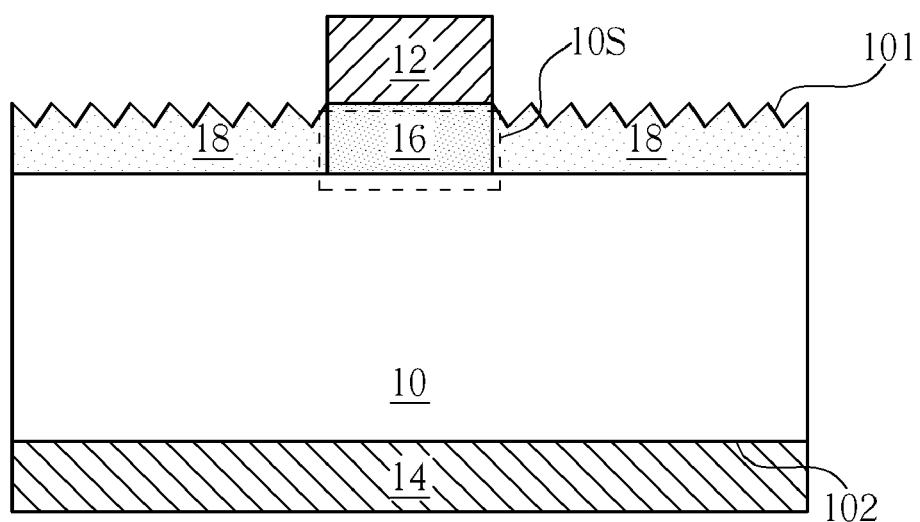

As shown in FIG. 4, a diffusion process (namely thermal process, heating process, or thermal annealing process) is performed to make the doping agent of the doping paste 12 on the selective emitter region 10S diffuse downwardly into the semiconductor substrate 10 to form a selective emitter 16 which is heavily-doped (also referred to as heavily-doped region). Meanwhile, a doping component (such as doping gas) is introduced during the diffusion process to form a lightly-doped region 18 in the first surface 101 outside the selective emitter region 105, wherein concentration of the heavily-doped region is substantially greater than concentration of lightly-doped region. The process temperature of the diffusion process is preferably substantially higher than 800° C., but not limited thereto. The selective emitter 16 is able to reduce resistance, and thus both the open circuit voltage (Voc) and the fill factor (FF) can be improved. The lightly-doped region 18 can improve the photoelectric conversion efficiency. The selective emitter 16 and the lightly-doped region 18 have a first doping type. For example, if the first doping type is n type, the doping gas used in the diffusion process may include a gas containing n type dopant such as phosphorus oxychloride ($POCl_3$), and the doping agent of the doping paste 12 may be n type dopant. Accordingly, the selective emitter 16 may be heavily n type doped, while the lightly-doped region 18 may be lightly n type doped. If the first doping type is p type, the doping gas used in the diffusion process may include a gas containing p type dopant, and the doping agent of the doping paste 12 may be p type dopant. Accordingly, the selective emitter 16 may be heavily p type doped, while the lightly-doped region 18 may be lightly p type doped. Also, the doping type of the semiconductor substrate 10 may be selected based on the specification of the solar cell. The semiconductor substrate 10 may have a second doping type, which is opposite to the first doping type. For example, the selective emitter 16 and the lightly-doped region 18 may be n type doped, while the semiconductor substrate 10 may be p type doped, and vice versa. The semiconductor substrate 10, however, may have the first doping type as the selective emitter 16 and the light-doped region 18 do. For example, the semiconductor substrate 10, the selective emitter 16 and the light-doped region 18 may all be the same n type doped or n type doped.

Figure 6:
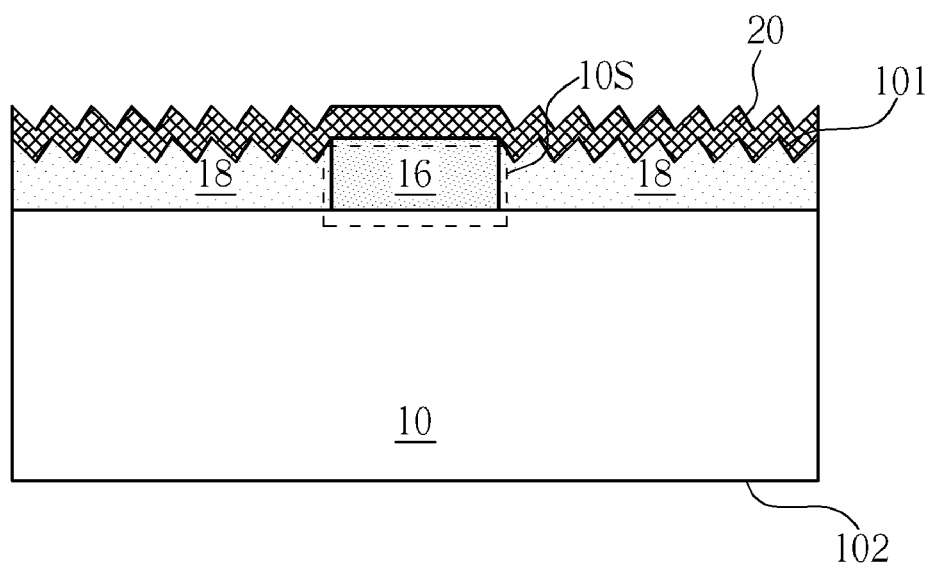

As shown in FIG. 5, the doping paste 12 and the texturing barrier layer 14 are removed. The doping paste 12 and the texturing barrier layer 14 can be removed simultaneously by the same wet etching process. For instance, a hydrofluoric acid solution can be used to remove the doping paste 12 on the first surface 101 and the texturing barrier layer 14 on the second surface 102 at the same time, but not limited. A dry etching process, or a combination of a dry etching process and a wet etching process can be performed as well. As shown in FIG. 6, an anti-reflection layer 20 is formed on the first surface 101 of the semiconductor substrate 10. In this embodiment, the anti-reflection layer 20 is formed conformally on the first surface 101 of the semiconductor substrate 10, and thus the anti-reflection layer 20 has a textured surface outside the selective emitter region 10S, and a non-textured surface (namely even surface or flatness surface) inside the selective emitter region 10S. The anti-reflection layer 20 can increase the amount of light entry, and therefore improves light utilization efficiency. The anti-reflection layer 20 may be a single-layered structure or a multi-layered structure. The material of the anti-reflection layer 20 may be, for example, silicon nitride, silicon oxide, silicon oxynitride, or other suitable material, and formed by, for example, a plasma enhanced chemical vapor deposition (PECVD) process, but not limited thereto.

Figure 7:
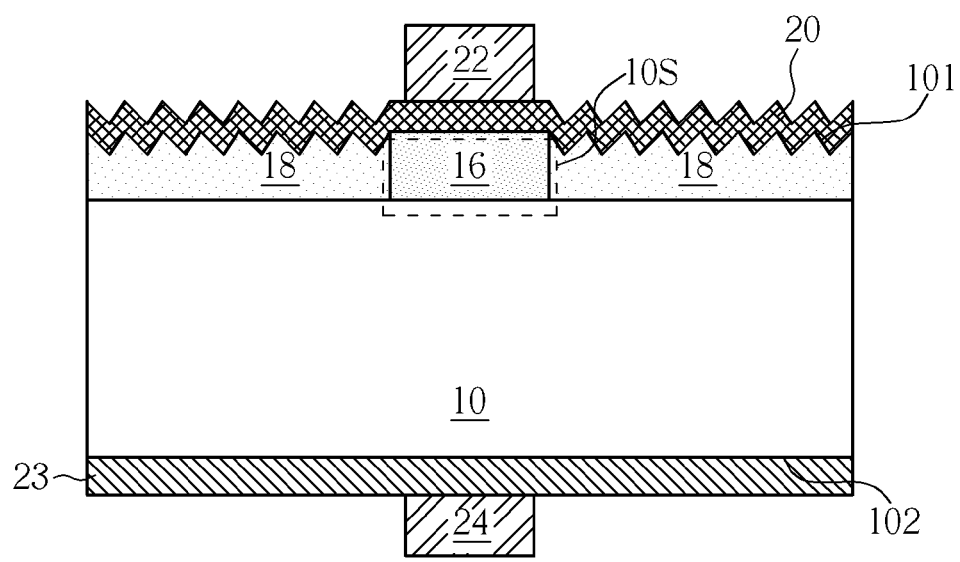

Steps of forming a first electrode 22 on the first surface 101, and forming a doped region 25 and a second electrode 24 are then executed as follows. As shown in FIG. 7, a first electrode 22 is formed on the selective emitter 16 in the selective emitter region 10S. The first electrode 22 may be a single-layered structure or a multi-layered structure, and serves as the finger electrode of the solar cell. The material of the first electrode 22 may be highly conductive material e.g. silver (Ag), gold (Au), or copper (Cu), but not limited thereto. A metal layer 23 and a second electrode 24 are formed on the second surface 102 of the semiconductor substrate 10. In this embodiment, the metal layer 23 may be a single-layered or a multi-layered soft metal layer. The material of the metal layer 23 may be, for example, lead (Pb), tin (Sn), aluminum (Al), or alloy thereof, preferably aluminum or aluminum alloy, but not limited thereto. The second electrode 24 may be a single-layered structure or a multi-layered structure, and serves as the back electrode of the solar cell. The material of the second electrode 24 may be highly conductive material e.g. silver (Ag), gold (Au), or copper (Cu), but not limited thereto. The order of forming the first electrode 22, the metal layer 23 and the second electrode 24 is not limited, and the first electrode 22, the metal layer 23 and the second electrode 24 are preferably formed by printing, but not limited thereto. The first electrode 22, the metal layer 23 and the second electrode 24 may also be formed by for example depositing, inkjet printing, screen printing, etc.

Figure 8:
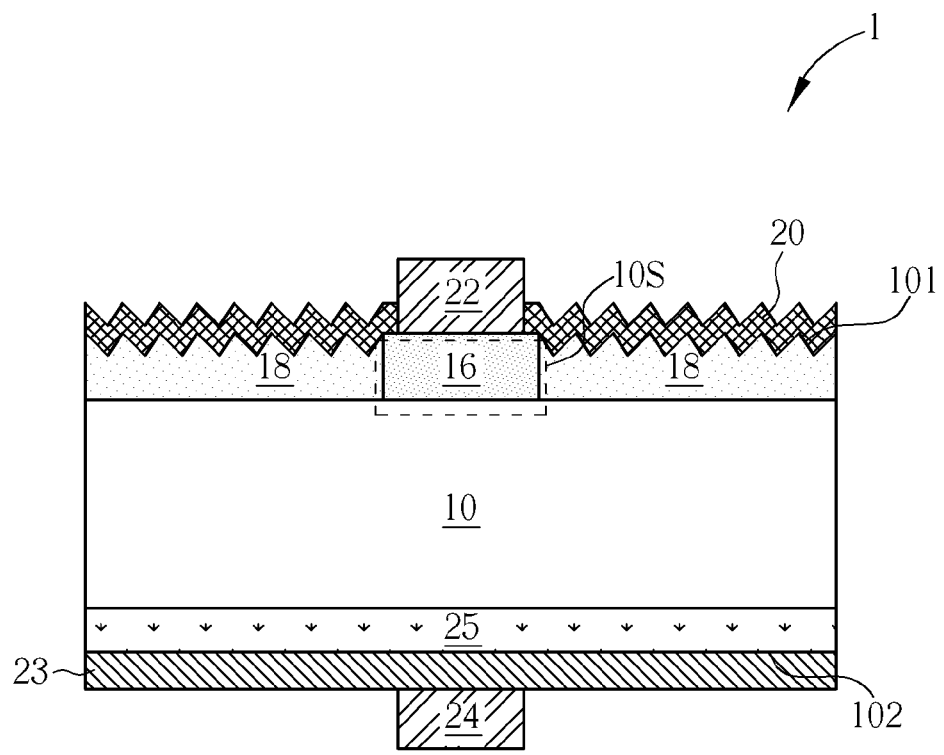

As shown in FIG. 8, a sintering process is performed to make the first electrode 22 electrically connect with the selective emitter 16, and to make the metal layer 23 and the semiconductor substrate 10 form a metal silicide, which forms the doped region 25 serving as the back surface field (BSF). Accordingly, a solar cell 1 of this embodiment is accomplished. In this embodiment, when aluminum or aluminum alloy is used as the material of the metal layer 23, the doped region 25 will be made of aluminum silicide. In addition, the doped region 25 must have the second doping type. Namely, the doping type of the doped region 25 must be opposite to the doping type of the selective emitter 16 and the lightly-doped region 18. For example, if the selective emitter 16 and the lightly-doped region 18 are n type, the doped region 25 must be p type; if the selective emitter 16 and the lightly-doped region 18 are p type, the doped region 25 must be n type. The doping type of the semiconductor substrate 10 is not limited, and may be identical to that of the selective emitter 16 and the lightly-doped region 18, or identical to that of the doped region 25.

The method of forming solar cell is not limited by the aforementioned embodiment, and may have other different preferred embodiments, which will be illustrated in the following passages. To simplify the description, the identical components in each of the following embodiments are marked with identical symbols. For making it easier to compare the difference between the embodiments, the following description will detail the dissimilarities among different embodiments and the identical features will not be redundantly described.

Figure 9:
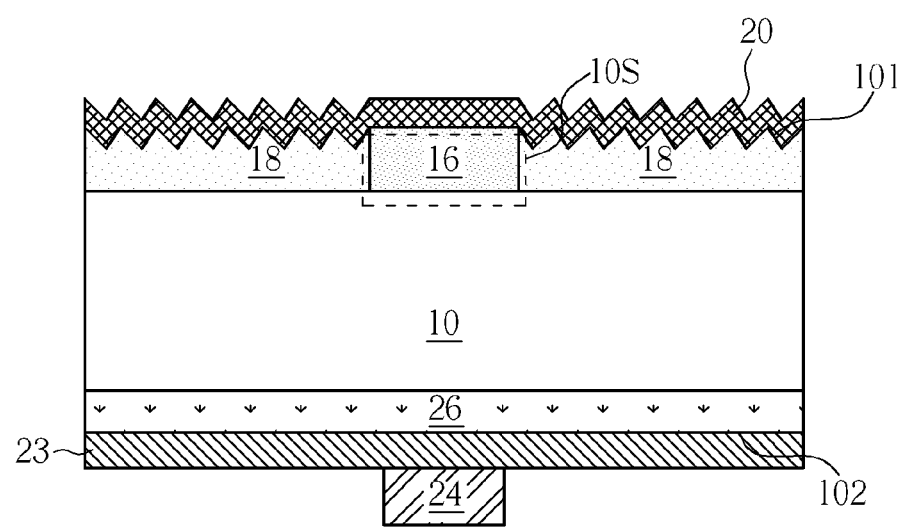
FIG. 9 and FIG. 10 are schematic diagrams illustrating a method of forming solar cell according to another exemplary embodiment.
Figure 10:
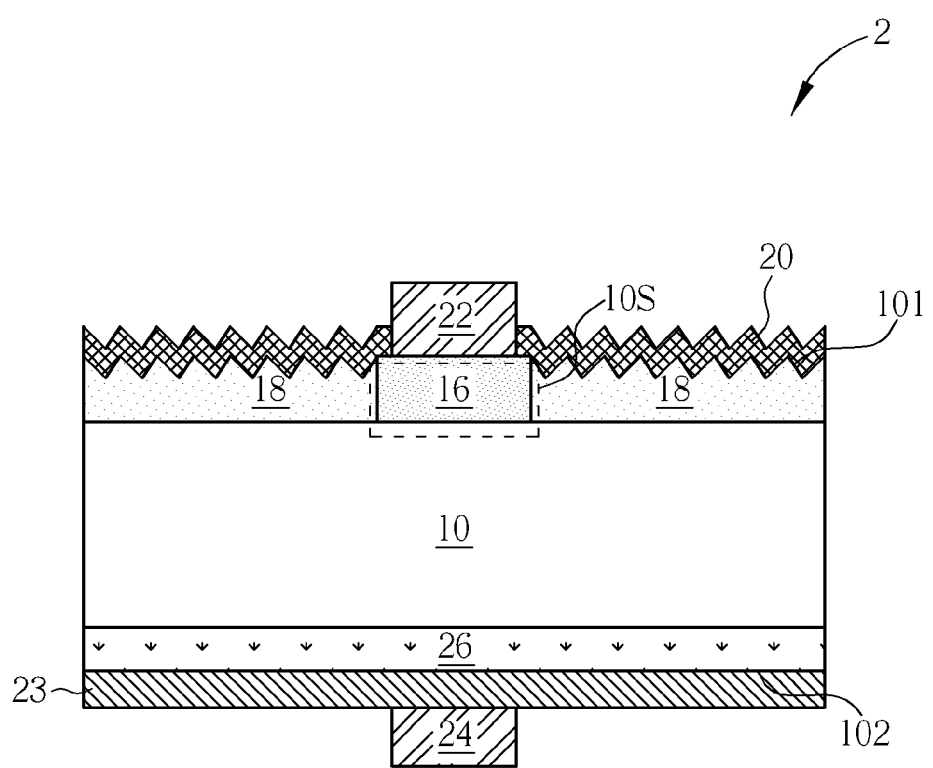

Please refer to FIG. 9 and FIG. 10, as well as FIGS. 1-6. FIG. 9 and FIG. 10 are schematic diagrams illustrating a method of forming solar cell according to another exemplary embodiment. The difference between this embodiment and the above embodiment is in the step of forming the doped region. The method of forming solar cell of this embodiment is performed subsequent to the step of FIG. 6. As shown in FIG. 9, another diffusion process is performed by introducing at least one doping process (such as doping gas, ionic shower) to form a doped region 26 having the second doping type in the second surface 102. If the second doping type is n type, the doping gas used in the diffusion process may include n type doping gas; if the second doping type is p type, the doping gas used in the diffusion process may include p type doping gas. Specifically, the doped region 26 in this embodiment is formed by diffusion, while the doped region in the above embodiment is formed by a metal layer.

As shown in FIG. 10, a first electrode 22 is formed on the selective emitter 16 in the selective emitter region 10S, and a second electrode 24 is formed on the second surface 102 of the semiconductor substrate 10. Subsequently, a sintering process is performed to make the first electrode 22 electrical connect with the selective emitter 16 to form a solar cell 2 of this embodiment.

In conclusion, the method of forming solar cell of the invention turns the first surface of the lightly-doped region a textured surface, and turns the first surface of the selective emitter region and the second surface a non-textured surface. The textured surface of the lightly-doped region increases the amount of light entry and light utilization efficiency, and the non-textured surface of the selective emitter region and the second surface prevents the semiconductor substrate from being damaged, which thus can reduce the resistance, increase the light reflection of the second surface, and improve the short circuit current gain of the solar cell. In addition, the doping paste is used to form the selective emitter and to prevent the selective emitter region from turning a textured surface in the texturing treatment, and the texturing barrier layer is used to prevent the second surface from turning a textured surface in the texturing treatment. The doping paste and the texturing barrier layer can be formed by printing, and removed simultaneously by wet etching. Accordingly, the method of forming solar cell of the invention has the advantages of simplified process and low fabrication cost.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming solar cell, comprising:
   providing a semiconductor substrate having a first surface and a second surface, wherein the first surface having a selective emitter region;
   forming a doping paste on the selective emitter region of the first surface of the semiconductor substrate, wherein the doping paste comprises a doping agent, a high temperature resistant material and an organic solvent;
   forming a texturing barrier layer on the second surface of the semiconductor substrate;
   performing a texturing treatment on the semiconductor substrate to make the first surface of the semiconductor substrate, which is outside the selective emitter region and uncovered by the doping paste, form a textured surface, and to make the second surface of the semiconductor substrate form an even surface;
   performing a diffusion process to make the doping agent of the doping paste on the selective emitter region diffuse downwardly into the semiconductor substrate to form a selective emitter which is heavily-doped, and introducing a doping gas during the diffusion process to form a lightly-doped region in the first surface outside the selective emitter region, wherein the selective emitter and the lightly-doped region have a first doping type;
   removing the texturing barrier layer and the doping paste;
   forming an anti-reflection layer on the first surface of the semiconductor layer;
   forming a first electrode on the selective emitter in the selective emitter region;
   forming a doped region in the second surface of the semiconductor substrate, wherein the doped region has a second doping type opposite to the first doping type; and
   forming a second electrode on the second surface of the semiconductor substrate.

2. The method of forming solar cell of claim 1, wherein the doping agent comprises an n type dopant or a p type dopant.

3. The method of forming solar cell of claim 1, wherein a material of the high temperature resistant material comprises silicon oxide, silicon oxynitride, metal oxide, silicon nitride or a mixture of at least two of the aforementioned materials.

4. The method of forming solar cell of claim 1, wherein the anti-reflection layer inside the selective emitter region has an even surface, and the anti-reflection layer outside the selective emitter region has a textured surface.

5. The method of forming solar cell of claim 1, wherein the texturing barrier layer and the doping paste are formed respectively by a printing process, and the texturing barrier layer and the doping paste are removed simultaneously by an etching process.

6. The method of forming solar cell of claim 1, wherein the semiconductor substrate has the first doping type.

7. The method of forming solar cell of claim 1, wherein the semiconductor substrate has the second doping type.

8. The method of forming solar cell of claim 1, wherein the first electrode and the second electrode are formed respectively on the first surface and the second surface by a printing process.

9. The method of forming solar cell of claim 1, further comprising performing a sintering process to electrically connect the first electrode with the selective emitter subsequent to forming the first electrode.

10. The method of forming solar cell of claim 9, wherein the step of forming the doped region in the second surface of the semiconductor substrate comprises:
    forming a metal layer on the second surface of the semiconductor substrate; and
    performing the sintering process to make the metal layer and the semiconductor substrate form a metal silicide, which forms the doped region.

11. The method of forming solar cell of claim 10, wherein the metal layer comprises a soft metal layer.

12. The method of forming solar cell of claim 1, wherein the step of forming the doped region in the second surface of the semiconductor substrate comprises introducing another doping process to perform another diffusion process.

13. The method of forming solar cell of claim 1, wherein the texturing barrier layer excludes the doping agent.

* * * * *